United States Patent [19]

Bright

[11] Patent Number: 5,256,080
[45] Date of Patent: Oct. 26, 1993

[54] BAIL ACTUATED ZIF SOCKET

[75] Inventor: Edward J. Bright, Middletown, Pa.

[73] Assignee: The Whitaker Corporation, Wilmington, Del.

[21] Appl. No.: 893,931

[22] Filed: Jun. 12, 1992

[51] Int. Cl.⁵ ............................................. H01R 4/50
[52] U.S. Cl. .................................. 439/342; 439/259; 439/487
[58] Field of Search ............... 439/269, 262, 263, 264, 439/266, 267, 268, 342, 331, 487, 159

[56] References Cited

U.S. PATENT DOCUMENTS

| | | | |
|---|---|---|---|
| 3,904,262 | 9/1975 | Cutchaw | 439/487 |
| 4,456,318 | 6/1984 | Shibata et al. | 439/261 |
| 4,498,725 | 2/1985 | Bright et al. | 339/176 |
| 4,593,463 | 6/1986 | Kamono et al. | 29/884 |
| 4,744,768 | 5/1988 | Rios | 439/264 |
| 4,836,790 | 6/1989 | Narita | 439/159 |
| 4,943,846 | 7/1990 | Shirling | 357/80 |
| 4,988,310 | 1/1991 | Bright et al. | 439/342 |
| 5,037,381 | 8/1991 | Uratsuji et al. | 439/342 |
| 5,057,031 | 10/1991 | Sinclair | 439/261 |
| 5,067,904 | 11/1991 | Takeuchi et al. | 439/73 |
| 5,092,789 | 3/1992 | Sinclair | 439/259 |
| 5,123,850 | 6/1992 | Elder et al. | 439/487 |
| 5,123,855 | 6/1992 | Petersen | 439/263 |
| 5,147,213 | 9/1992 | Funk et al. | 439/342 |
| 5,167,515 | 12/1992 | Matsuoka et al. | 439/342 |

Primary Examiner—Daniel W. Howell
Assistant Examiner—Hien D. Vu
Attorney, Agent, or Firm—Robert J. Kapalka

[57] ABSTRACT

An electrical socket (1) comprises, a lever (21) pivotally attached to a base housing (4), a cam (25) rotatable by pivoting the lever (21), the cam (25) having a lobe (26) for urging a cover (7) slidable along the housing (4) to urge electrical leads (3) of an electronic package (2) into engagement with electrical contact elements (6) in the housing (4), and the lever (21) being constructed as a bail for opening the socket (1) to permit low insertion force insertion of the electrical leads (3).

15 Claims, 8 Drawing Sheets

BAIL ACTUATED ZIF SOCKET

FIELD OF THE INVENTION

The invention pertains to an electrical socket, known as a PGA socket, with multiple electrical contact elements for connection to electrical leads of an electronic package, known as a PGA package.

BACKGROUND OF THE INVENTION

A known PGA socket, disclosed in U.S. Pat. No. 4,498,725, comprises, a base housing having cavities, contact elements in the cavities, a cover slidable along the housing for moving leads of an electronic package into engagement with respective contact elements, and a lever pivotally attached to the base, a portion of the lever being urged pivotally against the cover for urging the cover slidable along the housing.

As described in U.S. Pat. No. 4,988,310, a tool actuated PGA socket has a cover that is slidable, but requires a separate tool to slide the cover.

An industry requirement is for a PGA socket that permits a consumer to perform an upgrade, that is, to exchange a PGA package with an improved PGA package without reliance upon a tool. A further industry requirement is for a PGA socket that is adapted for exchanging PGA electronic packages without reliance upon a trained technician to perform the upgrade.

SUMMARY OF THE INVENTION

According to an embodiment of the invention, an electrical socket comprises, a lever pivotally attached to a base housing, a cam rotatable by pivoting the lever, the cam having a lobe for urging a cover slidable along the housing to urge electrical leads of an electronic package into engagement with electrical contact elements in the housing.

The invention will now be described with reference to the drawings, according to which;

DETAILED DESCRIPTION

Figure 3:
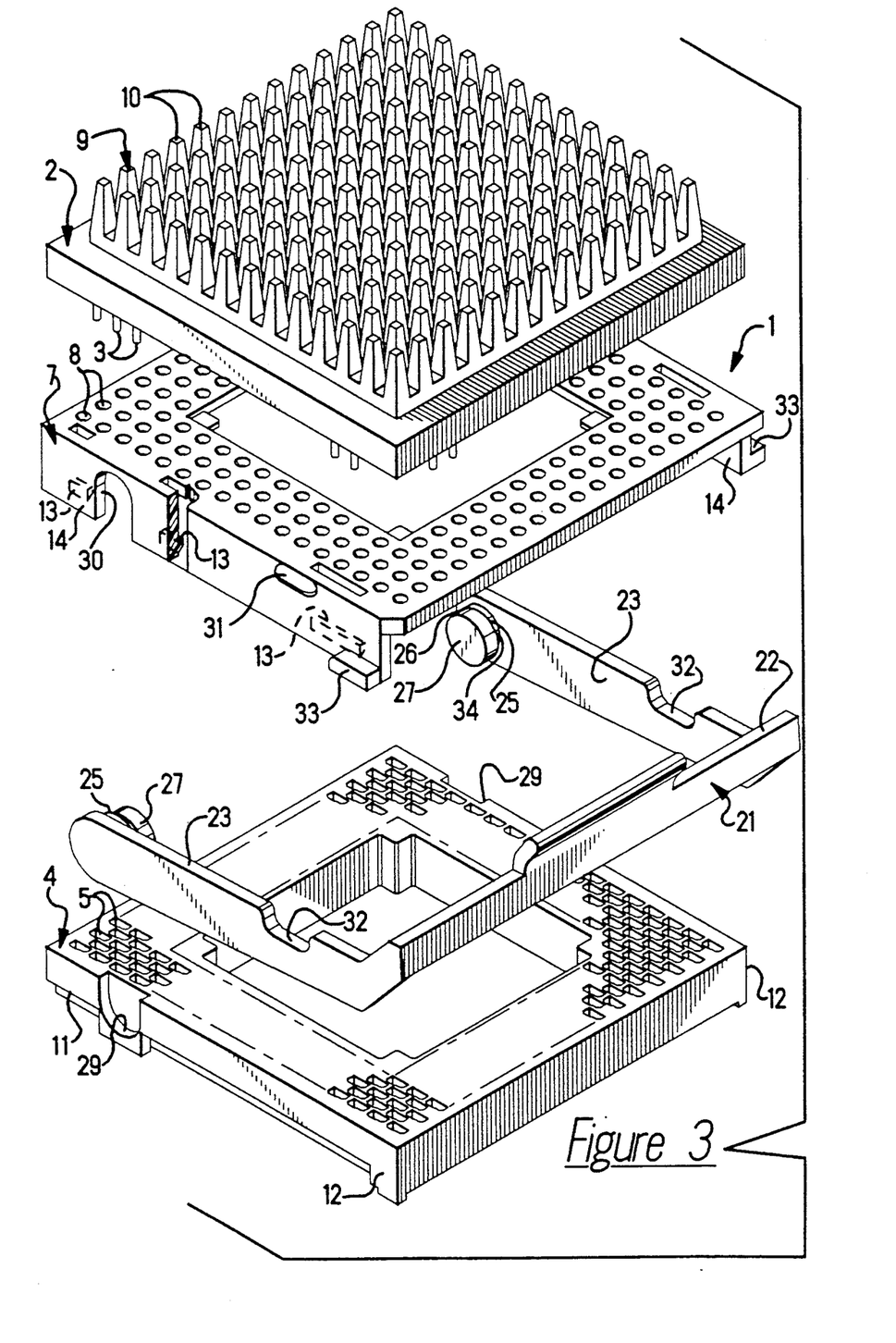
FIG. 3 is a perspective view of the socket shown in FIG. 2 with component parts separated from one another.
Figure 8:
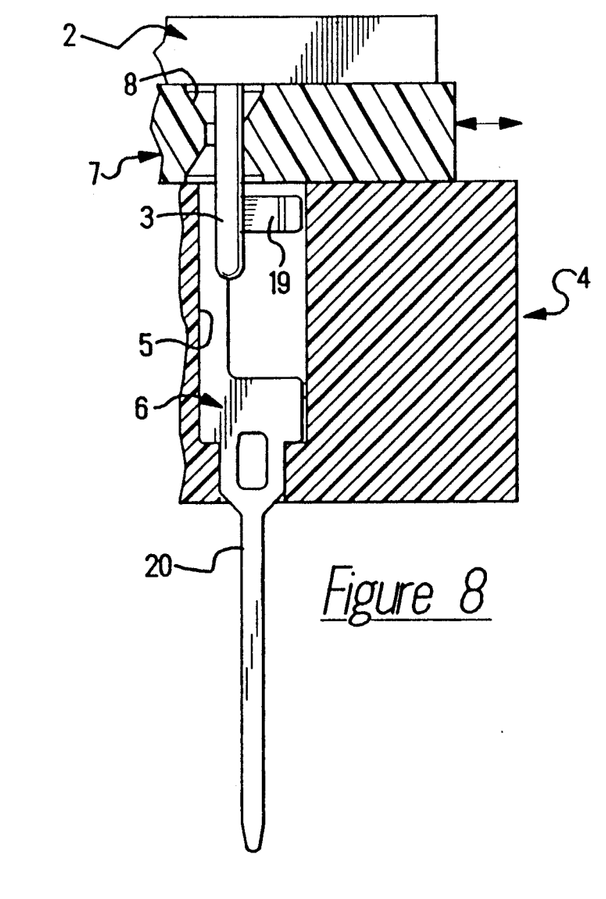
FIGS. 8 and 9 are fragmentary views in section illustrating a portion of the socket in open and closed positions, together with a PGA electronic package.
Figure 9:
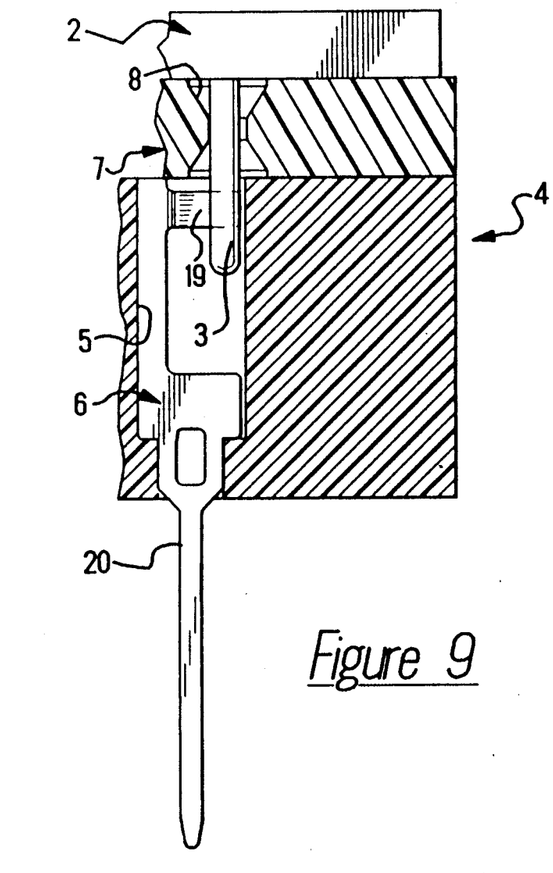

Reference will now be made to FIG. 3, wherein a socket 1 for an electronic package 2 having electrical leads 3, comprises, a base housing 4 having contact receiving cavities 5, conductive contact elements 6, FIG. 8, in the cavities 5, a cover 7 having lead receiving openings s receiving the electrical leads 3, the cover 7 being slidable along the housing 4 for moving the leads 3 into engagement with respective contact elements 6, FIG. 9. A conductive heat sink 9 carried on the electronic package 2 has multiple projecting pillars 10 for dissipating heat generated by the electronic package 2.

Slotted openings 11 along opposite sides 12 of the housing 4 are received in projecting ears 13 on depending skirts 14 of the cover 7 that overlap the sides 12. The ears 13 hold the cover 7 to the housing 4 while the ears 13 are moved back and forth relative to the openings 11 when the cover 7 slides back and forth.

In the open position, the leads 3 can be inserted into the openings 8 of the cover 7 and into the cavities 5 of the housing 4 without frictional resistance by the contact elements 6, thereby to provide a zero insertion force, ZIF, capability. Movement of the cover 7 to a closed position, FIG. 9, urges the cover 7 to slide, and urges the electrical leads 3 into engagement with the cantilever beams 19 of the contact elements 6, thereby electrically connecting the leads 3 to the conductive posts 20 for plugging into a circuit board, not shown. Further details of the socket 1 are described in U.S. Pat. No. 4,988,310.

Figure 1:
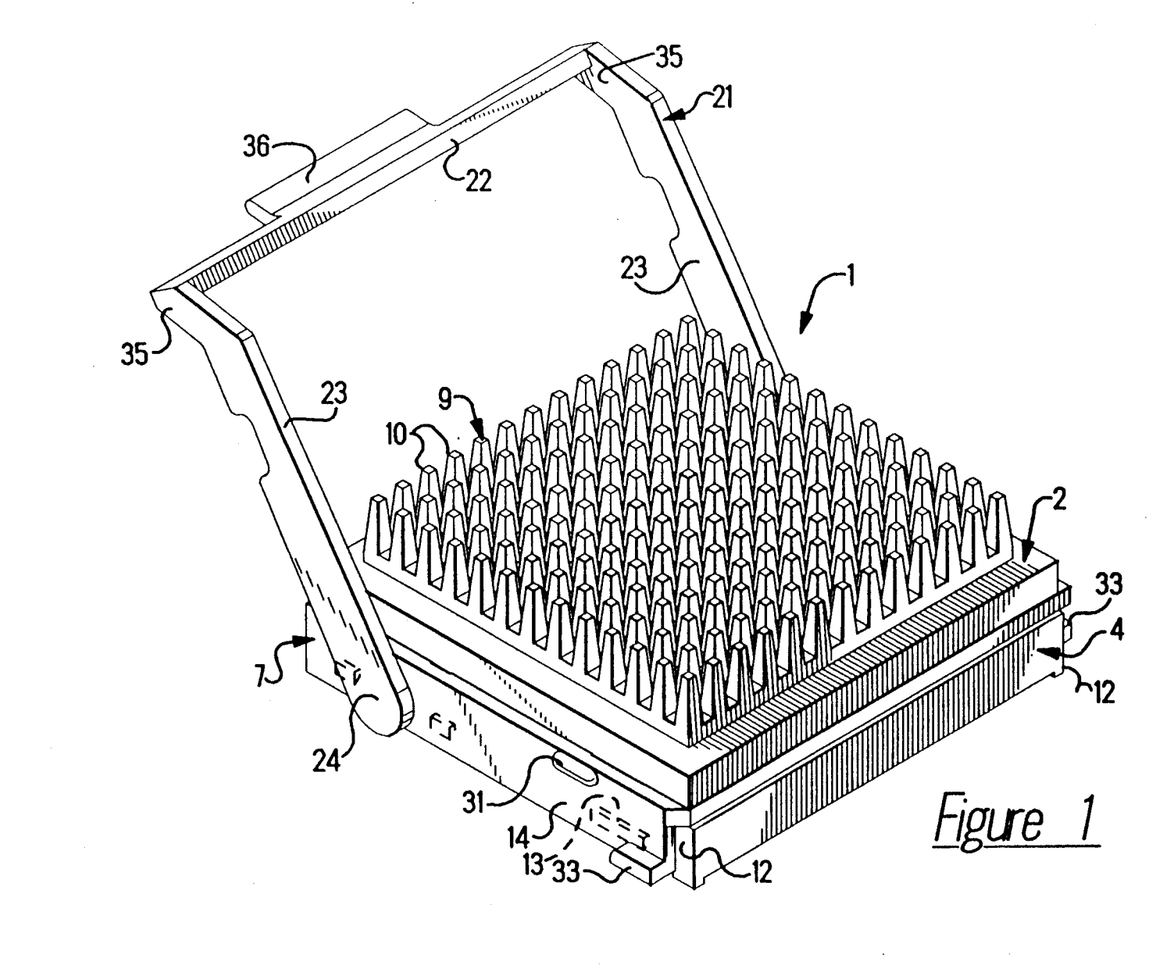
FIG. 1 is a perspective view of an electrical socket in an open position with a lever in a corresponding open position.
Figure 2:
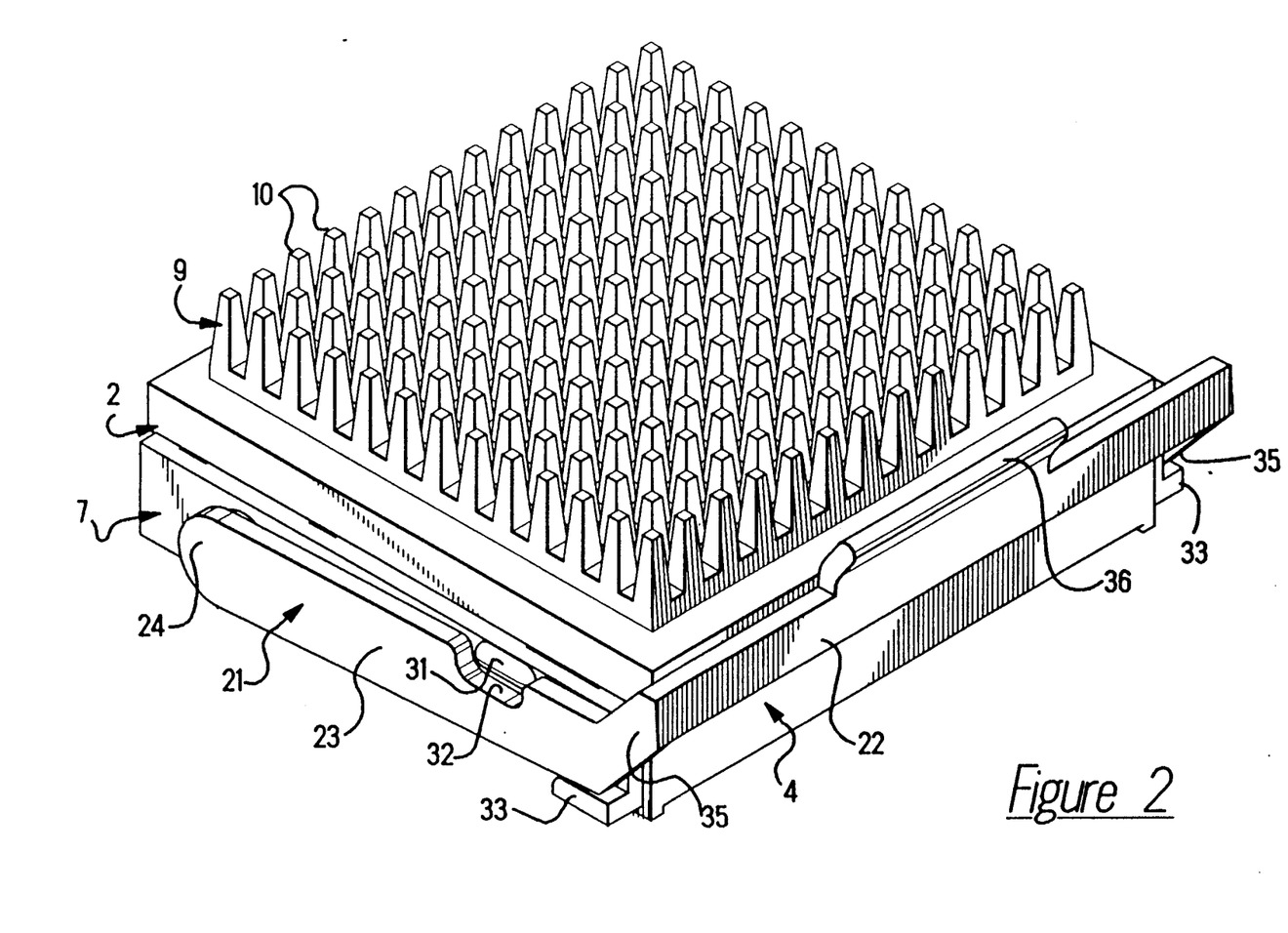
FIG. 2 is a perspective view of the socket shown in FIG. 1 in a closed position with the lever in a corresponding closed position.
Figure 4:
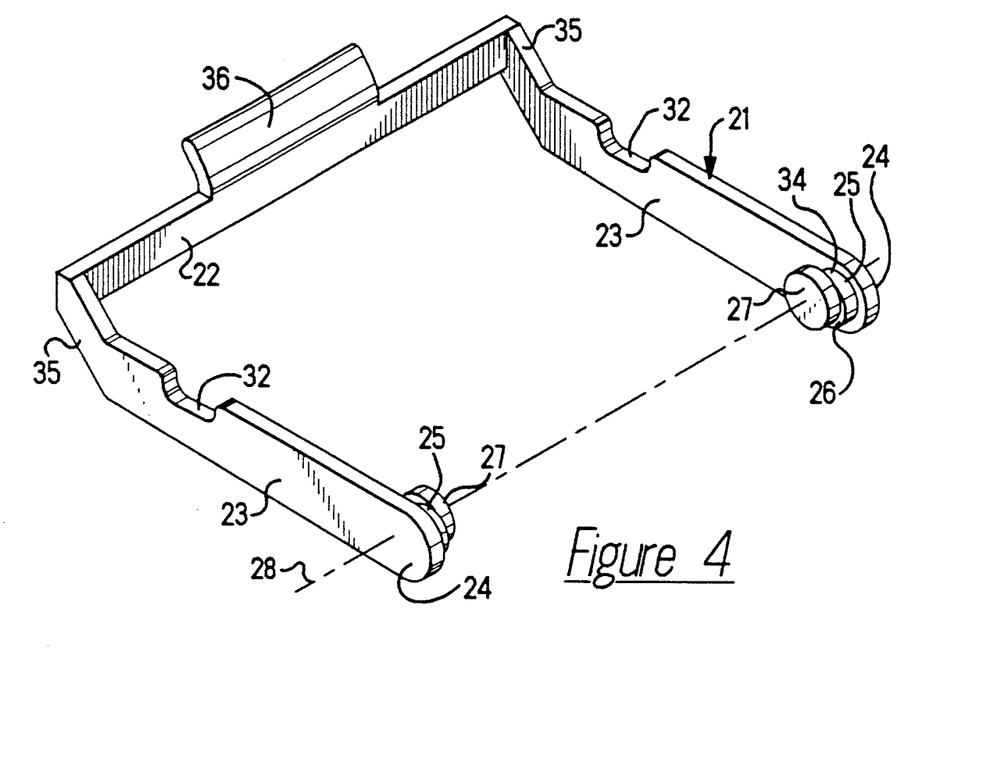
FIG. 4 is a perspective view of the lever.

A lever 21, FIG. 4, of unitary construction is pivotally attached to the housing 4, FIG. 1 and 3. The lever 21 is constructed as a rectangular bail with a cross bar 22 joining two sides 23, the sides 23 having two ends 24. The lever 21 includes a cam 25 with a lobe 26 and a cam shaft 27. The cam 25 and the shaft 27 are each divided into two parts at the ends 24 of the bail. The cam 25 has a cylindrical cam surface. The two parts of the shaft 27 project from the two parts of the cam 25, and are rotatable about an axis 28 of rotation. The axis of rotation is offset with respect to a cylindrical surface of the cylindrical cam 25. The two parts of the shaft 27 register for rotation in arch shaped journal blocks 29 recessed in the opposite sides 12 of the housing 4. The lever 21 is pivoted by rotation about the shaft 27. The lever 21, the shaft 27 and the cam 25 have a common axis 28 of rotation.

Cam receiving openings 30 are recessed in the depending skirts 14. The two parts of the cam 25 are rotatably received in the openings 30. The cam 25 is rotatable by pivoting the lever 21 about the shaft 27, either to a closed position, FIG. 5, or to an open position, FIG. 6. Upon rotation of the cam 25, the lobe 26 of each part of the cam 25 will urge against parallel sides of the openings 30 to urge the cover 7 slidable along the housing 4 to the open and closed positions. The parallel sides of each of the openings 30 span the diameter of the cam 25 and continuously engage the cylindrical surface of the cam 25. The cylindrical surface of the cam 25 is rotatable while engaged against the parallel sides of the openings 30.

Figure 5:
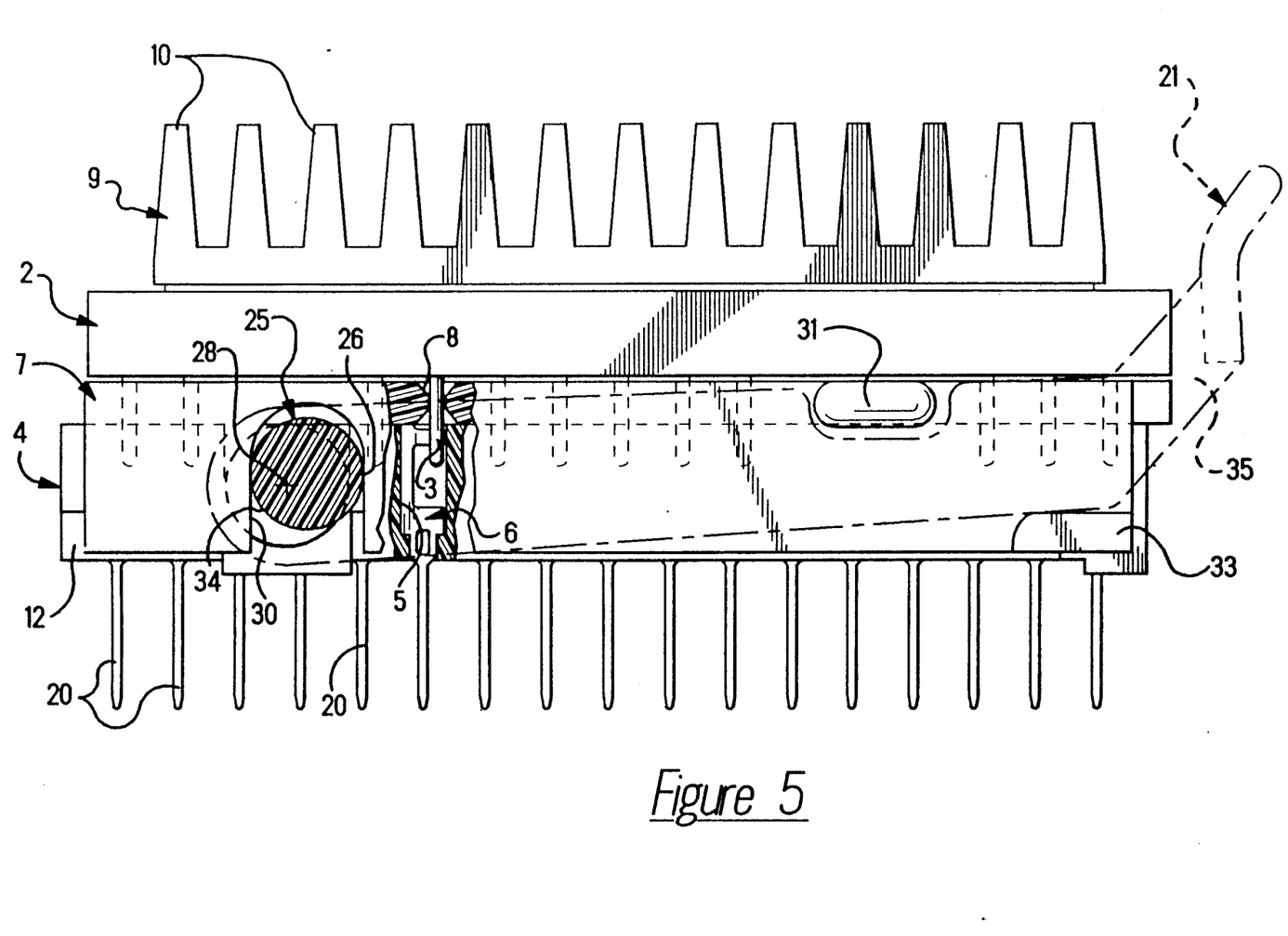
FIG. 5 is an elevation view of the socket in a closed position with parts broken away and with parts in section.

When the lever 21 is pivoted toward a closed position, FIG. 5, the lever 21 must frictionally pass over a latch 31 projecting from each skirt 14. The latch 31 engages the lever 21 and provides frictional resistance to further pivoting of the lever 21 only when the lever 21 is adjacent to its fully closed position. The frictional resistance is a positive indicator to a consumer that the lever 21 has been pivoted nearly to the end of its desired movement. The latch 31 interengages with an edge 32 of the lever 21 to retain the lever 21 motionless in the closed position. The latch 31 can be overcome by the application of sufficient force to pivot the lever 21 from the closed position toward the open position, FIG. 6. In the closed position, FIG. 5, the lever 21 registers motionless against a stop 33 projecting from the skirts 14 to limit further movement of the lever 21 beyond a desired position. Further, the stop 33 is a positive indicator, which provides assurance to a consumer that the lever 21 is correctly in a closed position.

With the cover horizontal, the lever in a closed position is inclined about two degrees from the horizontal. The lobe 26 of the cam 25 is elevated at an angle of approximately thirty degrees from the horizontal, using the axis of rotation 28 as the apex of the angle.

Figure 6:
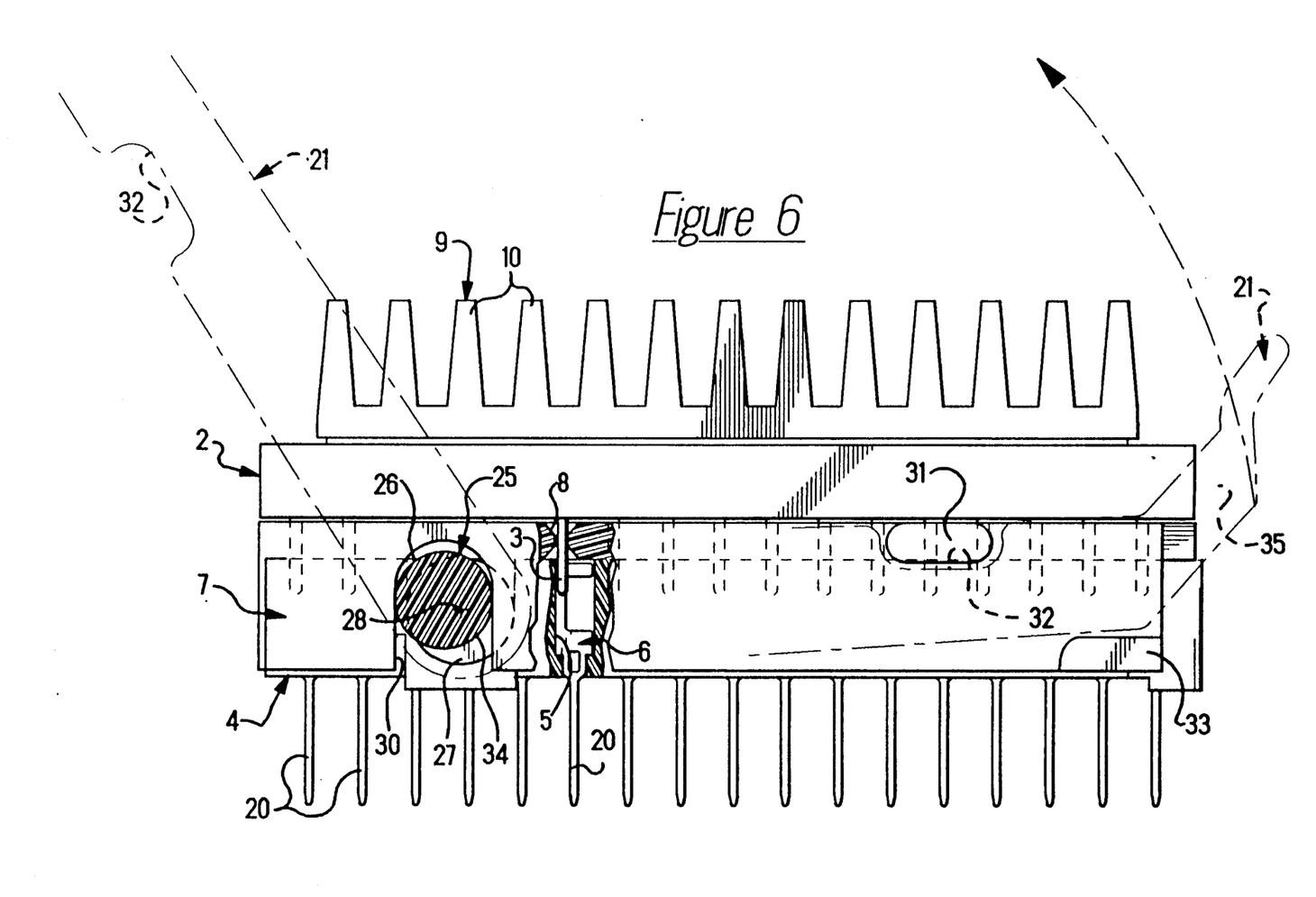
FIG. 6 is an elevation view similar to FIG. 5 illustrating the, socket in an open position with the lever in a corresponding open position.

With reference to FIG. 6, the lever 21 has been pivoted from the closed position to the open position, and through a geometric obtuse angle of about 118 degrees to be positioned about 120 degrees from the horizontal. The lobe 26 of the cam 25 will be pivoted also about 118 degrees to be positioned about 148 degrees from the horizontal. The open position of the lever 21 corresponds to an open position of the cover, attained when the cover has been moved by the cam 25 horizontally a sufficient distance that the electrical leads 3 are disengaged from the beams 19, while the openings 8 are aligned with the cavities 5, thereby, to permit ease in removal of the leads 3, and to permit low insertion force insertion of the leads 3 into the openings 8 and the cavities 5 without engaging the beams 19.

Figure 7:
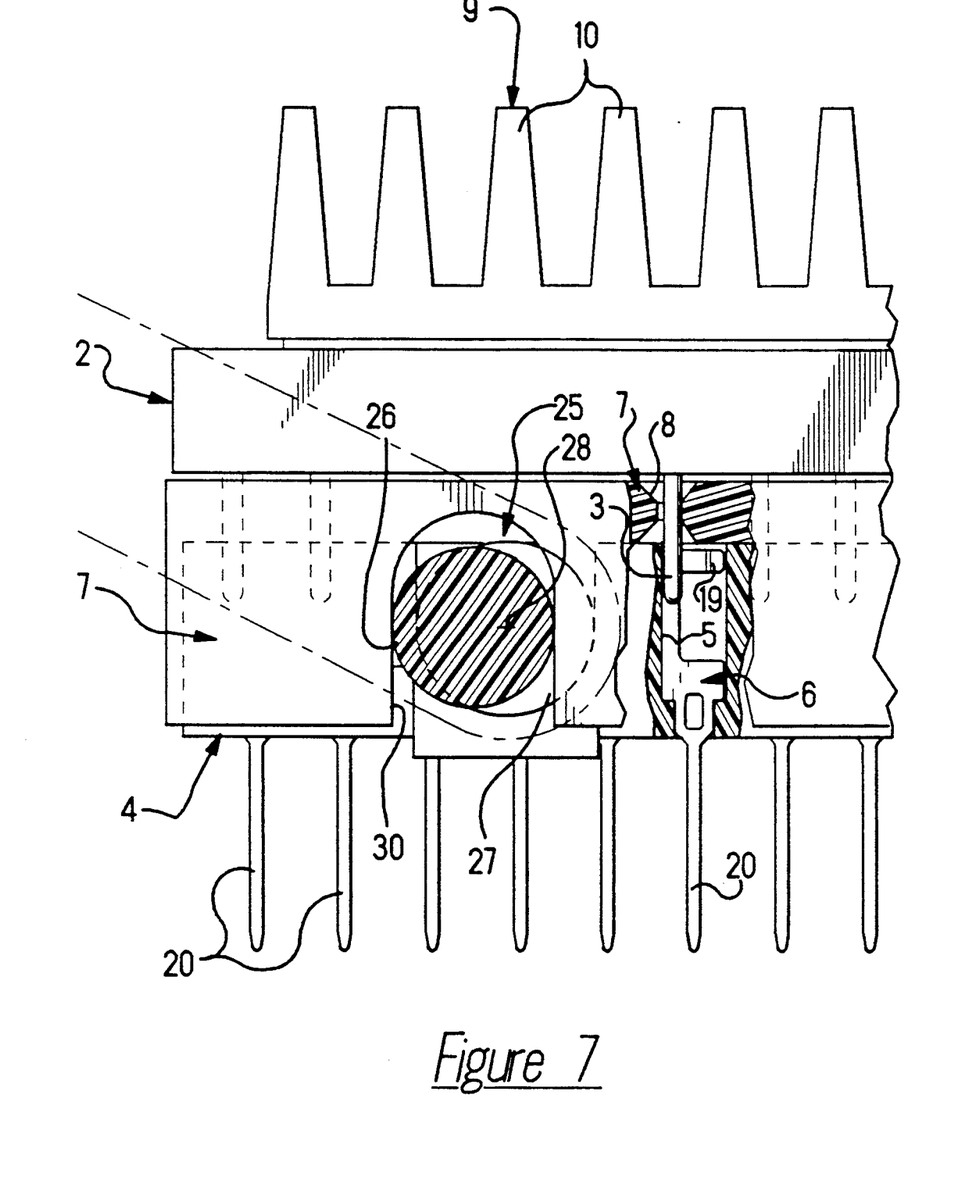
FIG. 7 is a view similar to FIG. 6 illustrating the socket in an open position and the lever being free to pivot beyond its position as shown in FIG. 6.

The lever 21, when pivoted through the obtuse angle, is unable to pivot by its own weight toward the closed position. Instead, the lever 21 will pivot by its own weight to a more open position, FIG. 7, away from the electronic package 2 to lie outside of a course to be followed by the electronic package 2 during its installation or removal with respect to the socket 1. FIG. 7 shows the maximum displacement of the cover 7 beyond the open position shown in FIG. 6. The lobe 26 on each part of the cam 25 has been rotated while being urged against the corresponding yoke 29 of the cover 7 to urge the cover 7 slidable along the housing 4 beyond the open position. Yet the openings 8 remain aligned, although not concentric, with the cavities 5, such that the leads 3 can be inserted or removed without engaging the beams 19.

With reference to FIG. 7, the lever 21 is free for an increment of pivotal movement beyond the open position of FIG. 6. A portion 34 of the cam 25 will bias the cover 7 during the increment of pivotal movement of the lever 21. The portion 34 comprises a portion of the cylindrical surface of the cam 25. Further pivoting of the lever 21 to a horizontal position, not shown, will cause the cover 7 to be displaced to a position between its positions shown in FIGS. 6 and 7.

The lever 21 is constructed for compactness. The sides 23 of the lever 21 are relatively thin, and lie alongside the skirts 14 when the lever 21 is in the closed position. Only the thickness of each of the sides 23 juts out from the skirts 14. The sides 23 are upwardly offset 35 along their lengths to elevate the cross bar 22 above the cover 7 and the housing 4. A widened surface 36 of the cross bar 22 provides a handle, and is a visually prominent feature that is recognizable by a consumer as being a handle.

The bail spans the cover 7 and defines a clearance between the bail and the cover 7 for the electronic package 2 on the cover 7 and for the heat sink 9. The elevated construction of the bail is adapted to pass over the heat sink 9 upon pivoting of the lever 21.

An advantage of the invention resides in a bail for closing and opening a socket 1 for an electronic package 2. Another advantage resides in a bail actuated socket 1 that is adapted for operation by a consumer without relying upon a trained technician. Another advantage resides in a bail spanning a socket 1 and avoiding movement by its own weight toward a closed position. Another advantage resides in a bail spanning a socket 1 that tends to move by its own weight to a more open position. Another advantage resides in a bail for a socket 1 that interengages with a latch 31 and a stop 33 to render the bail motionless in a closed position.

I claim:

1. A socket for an electronic package having electrical leads, comprising:

a housing having contact elements, a cover slidable along the housing, a lever pivotally attached to the housing, and a cam rotatable by pivoting the lever, the cam having a lobe rotatable against the cover for sliding the cover along the housing, the cover and the lever being moveable from respective open positions to respective closed positions for moving the leads of the electronic package into engagement with respective ones of the contact elements, the lever being disposed substantially horizontal when in the closed position, a latch comprised of interengaging latching structure on the lever and the cover for retaining the lever in the closed position, the latch being overcome by applying a force to pivot the lever, and the lever being pivotable upwardly from the closed position through an obtuse angle to the open position, wherein the lever is urged by gravity to remain in the open position.

2. A socket as recited in claim 1, wherein: the cam is circular with an offset axis of rotation.

3. A socket as recited in claim 1, wherein: the lever is constructed as a bail spanning the cover and defining a clearance between the bail and the cover for an electronic package on the cover and for a heat sink on the electronic package, and the bail is adapted to pass over the heat sink upon pivoting of the lever.

4. A socket as recited in claim 3, comprising:

a stop on the socket engaged by the lever for limiting movement of the lever.

5. A socket for an electrical package having electrical leads, comprising:

a housing having contact elements, a cover slidable along the housing, a lever pivotally attached to the housing, a cam being pivotable by pivoting the lever, the cam having a lobe rotatable against the cover for sliding the cover along the housing, the lever being constructed as a bail spanning the cover, the cam being divided into two parts at respective ends of the bail, each of the two parts being pivotally coupled to the housing by a shaft, the cover and the lever being movable from respective open positions to respective closed positions for moving the leads of the electronic package into engagement with respective ones of the contact elements, the lever being pivotable upwardly from the closed position through an obtuse angle to the open position, wherein the lever is urged by gravity to a more open position.

6. A socket as recited in claim 5, wherein, the shaft comprises two parts that register in journal blocks recessed in opposite sides of the housing.

7. A socket as recited in claim 5, comprising:
a latch on the socket frictionally engaging the lever as the lever passes over the latch, and an edge on the lever interengaging with the latch when the lever has passed over the latch.

8. A socket as recited in claim 5, comprising:
a latch on the socket frictionally engaging the lever as the lever passes over the latch, an edge on the lever interengaging with the latch when the lever has passed over the latch, and a stop on the socket engaged by the lever for limiting pivoting movement of the lever.

9. A socket for an electronic package having electrical leads, comprising:
a housing having contact elements, a cover slidable along the housing, a lever pivotally attached to the housing, a cam being rotatable by pivoting the lever, the cam having a lobe rotatable against the cover for sliding the cover along the housing, the lever being constructed as a bail having at least one side connected to a cross bar, said side being offset along the length thereof so as to elevate the cross bar and define a clearance between the cross bar and the cover for an electronic package on the cover and for a heat sink on the electronic package, the cover and the lever being movable from respective open positions to respective closed positions for moving the leads of the electronic package into engagement with respective ones of the contact elements, the lever being pivotable upwardly from the closed position through an obtuse angle to the open position, wherein the lever is urged by gravity to a more open position.

10. A socket as recited in claim 9, and further comprising:
a handle on the elevated crossbar.

11. A socket as recited in claim 9, comprising:
a latch on the socket frictionally engaging the lever as the lever passes over the latch, and an edge on the lever interengaging with the latch when the lever has passed over the latch.

12. A socket as recited in claim 9, comprising:
a latch on the socket frictionally engaging the lever as the lever passes over the latch, an edge on the lever interengaging with the latch when the lever has passed over the latch, and a stop on the socket engaged by the lever for limiting pivoting movement of the lever.

13. A socket as recited in claim 9, wherein, the shaft comprises two parts that register in journal blocks recessed in opposite sides of the housing.

14. A socket as recited in claim 9, and further comprising:
a second side of said bail connected to said cross bar, said sides having ends, said cam is divided into two parts at the ends of said sides, a rotatable shaft divided into two parts projecting from said two parts of the cam and in registration in journal blocks recessed in opposite sides of said housing.

15. A socket as recited in claim 14, wherein, said two parts of the cam and said two parts of the shaft have a same axis of rotation.

* * * * *